(12) United States Patent
Yamamoto et al.

(10) Patent No.: US 9,003,352 B2
(45) Date of Patent: Apr. 7, 2015

(54) SEMICONDUCTOR INTEGRATED CIRCUIT DESIGN SUPPORTING APPARATUS, METHOD, AND PROGRAM

(71) Applicant: Mitsubishi Electric Corporation, Chiyoda-ku (JP)

(72) Inventors: Ryo Yamamoto, Chiyoda-ku (JP); Noriyuki Minegishi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/132,826

(22) Filed: Dec. 18, 2013

(65) Prior Publication Data
US 2014/0189633 A1    Jul. 3, 2014

(30) Foreign Application Priority Data

Dec. 28, 2012   (JP) ................................ 2012-286809
Nov. 8, 2013    (JP) ................................ 2013-231732

(51) Int. Cl.
*G06F 17/50*    (2006.01)

(52) U.S. Cl.
CPC .................................. *G06F 17/505* (2013.01)

(58) Field of Classification Search
CPC .............. G06F 17/505; G06F 17/5068; G06F 17/5045; G06F 17/5077; G06F 17/5036; G06F 17/5072; G06F 17/5031; G06F 17/5054; G06F 2217/84
USPC .......................... 716/104, 132, 133, 134, 135
See application file for complete search history.

(56) References Cited

U.S. PATENT DOCUMENTS

2011/0214098 A1*   9/2011   Tsukamoto ................... 716/108

FOREIGN PATENT DOCUMENTS

JP          2010-165334         7/2010

* cited by examiner

*Primary Examiner* — Vuthe Siek
(74) *Attorney, Agent, or Firm* — Oblon, McClelland, Maier & Neustadt, L.L.P.

(57) ABSTRACT

A latency adjusting part calculates a necessary delay based on the number of FFs that are required to be inserted between respective modules through high level synthesis of a behavioral description. An input FF stage number acquiring part extracts a pin having an input that receives an FF, and acquires the number of stages of input FFs of FF reception. A latency re-adjusting part obtains an optimum delay based on the above-mentioned necessary delay and input delay. A former-stage module analyzing part detects, based on the above-mentioned synthetic log or HDL, a state having a minimum total number of FFs. An FF insertion optimizing synthesis part subjects an entire circuit to high level synthesis again based on the above-mentioned optimum delay and an FF inserting position obtained based on the state having the minimum number of FFs, to thereby obtain optimized HDL.

6 Claims, 21 Drawing Sheets

| To | | From | | Necessary Delay |
|---|---|---|---|---|
| Module name | pin name | Module name | pin name | |
| C | a1 | A | a1 | 0 |
| C | a2 | A | a2 | 0 |
| C | b1 | B | b1 | 2 |
| C | b2 | B | b2 | 2 |

| To | | From | | Number of Stages of Input FFs |
|---|---|---|---|---|
| Module name | pin name | Module name | pin name | |
| C | a1 | A | a1 | 1 |
| C | a2 | A | a2 | 1 |
| C | b1 | B | b1 | 0 |
| C | b2 | B | b2 | 0 |

| To | | From | | Necessary Delay | Number of Stages of Input FFs | Pre-Optimization Delay | Optimum Delay |
|---|---|---|---|---|---|---|---|
| Module name | pin name | Module name | pin name | | | | |
| C | a1 | A | a1 | 0 | 1 | 1 | 0 |
| C | a2 | A | a2 | 0 | 1 | 1 | 0 |
| C | b1 | B | b1 | 2 | 0 | 2 | 1 |
| C | b2 | B | b2 | 2 | 0 | 2 | 1 |
Fig. 6
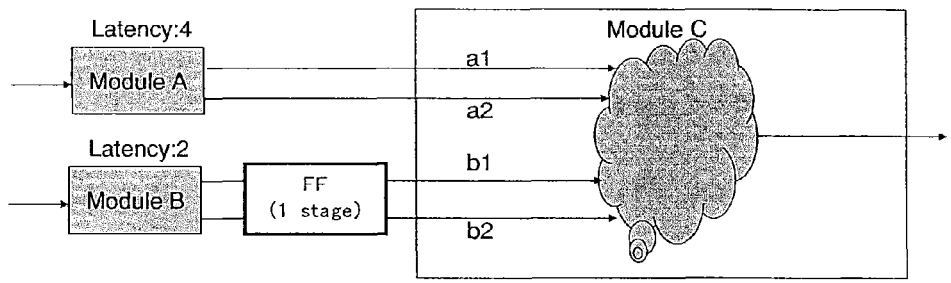
Fig. 7
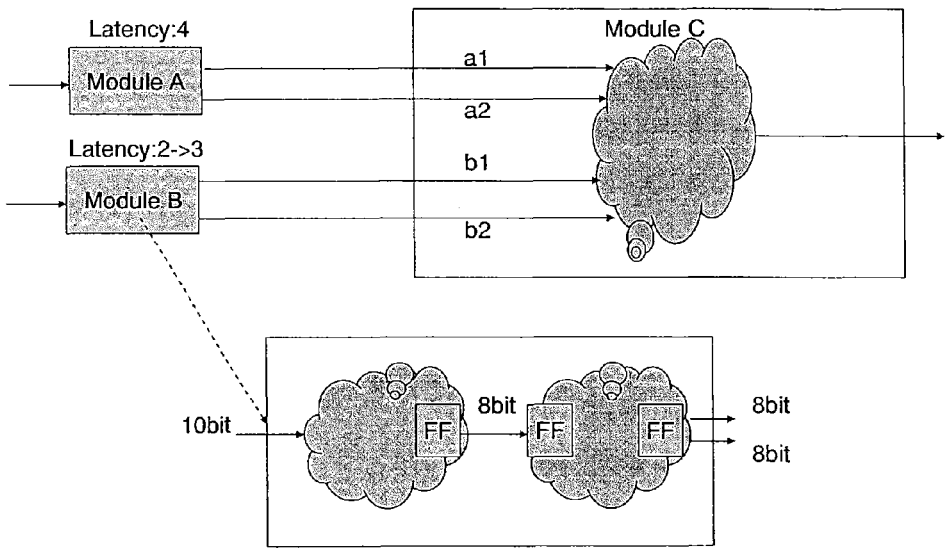
Fig. 8

```
class ModuleA:public sc_module{
  public:
    sc_in<bool> clk;
    sc_in<bool> rst;
    sc_in<unsigned int > ia1;
    sc_out<unsigned int > oa1;
    // hereinafter omitted
} class ModuleB:public sc_module{
  public:
    sc_in<bool> clk;
    sc_in<bool> rst;
    sc_in<sc_uint<8> > ib1;
    sc_in<sc_uint<8> > ib2;
    sc_out<sc_uint<12> > ob1;
    sc_out<sc_uint<12> > ob2;
    sc_out<sc_uint<11> > ob3;
    // partially omitted // Synthesis Target Process
    void run(void){
      sc_uint<9> b3;
      sc_uint<11> b4;
      sc_uint<12> b5;
      sc_uint<12> b6;
      wait();
      while(1){
        b3 = ib1.read() + ib2.read();
        b4 = b3 * 3;
        b5 = b4 >> 2 + b4;;
        b6 = b5 + 14;;
        ob1.write(b5);
        ob2.write(b6);
        ob3.write(b4);
        wait();
      }
    }
};
```

Fig. 10A

```
class ModuleC:public sc_module{
  public:
    sc_in<bool> clk;
    sc_in<bool> rst;
    sc_in<unsigned int > ic1;
    sc_in<sc_uint<12> > ic2;
    sc_in<sc_uint<12> > ic3;
    sc_out<unsigned int > oc1;
    // partially omitted // Synthesis Target Process
    void run(void){
      sc_uint<13> c1;
      unsigned int a2, d;
      wait();
      while(1){
        c1 = ic2.read() + ic3.read();
        d = c1 + a2;
        a2 = ic1.read();
        oc1.write(d);
        wait();
      }
    }
};
```

Fig. 10B

```
class ModuleE:public sc_module{
  public:
    sc_in<bool> clk;
    sc_in<bool> rst;
    sc_in<sc_uint<11> > ie1;
    sc_in<sc_uint<11> > ie2;
    sc_out<sc_uint<12> > oe1;
    // partially omitted // Synthesis Target Process
    void run(void){
      sc_uint<12> e1;
      wait();
      while(1){
        e1 = ie1.read() - 4;
        e1 = e1 + ie2.read();
        oe1.write(e1);
        wait();
      }
    }
};
```

Fig. 10C

```
class ModuleTop:public sc_module{
public :

sc_in<bool> clk;
  ...
  ModuleA mA;
  ModuleB mB;
  ModuleC mC;
  ModuleD mD;
  ModuleE mE;
  sc_signal<BIT1> s1;
  ....
// Connection
  SC_CTOR(ModuleTop) {
    mA.oa1(s1);
    mB.ob1(s2);
    mB.ob2(s3);
    mB.ob3(s4);
    mD.od1(s5);
    mC.ic1(s1);
    mC.ic2(s2);
    mC.ic2(s3);
    mE.ie1(s4);
    mE.ie2(s5);
    .....
};
```

Fig. 10D

Module A

| Input/Output pin name | I/O | Connected Module name | | Connected pin name |
|---|---|---|---|---|
| | | from | to | |
| ia1 | I | X | − | |
| oa1 | O | − | ModuleC | ic1 |

Module B

| Input/Output pin name | I/O | Connected Module name | | Connected pin name |
|---|---|---|---|---|
| | | from | to | |
| ib1 | I | X | − | X |
| ib2 | I | X | − | X |
| ob1 | O | − | ModuleC | ic2 |
| ob2 | O | − | ModuleC | ic3 |
| ob3 | O | − | ModuleE | ie1 |

Module C

| Input/Output pin name | I/O | Connected Module name | | Connected pin name |
|---|---|---|---|---|
| | | from | to | |
| ic1 | I | ModuleA | − | ia1 |
| ic2 | I | ModuleB | − | ib1 |
| ic3 | I | ModuleB | − | ib2 |
| oc2 | O | − | X | X |

Module D

| Input/Output pin name | I/O | Connected Module name | | Connected pin name |
|---|---|---|---|---|
| | | from | to | |
| id1 | I | X | − | X |
| od1 | O | − | ModuleE | ie2 |

Module E

| Input/Output pin name | I/O | Connected Module name | | Connected pin name |
|---|---|---|---|---|
| | | from | to | |
| ie1 | I | ModuleB | − | ob3 |
| ie2 | I | ModuleD | − | od1 |
| oe1 | O | − | X | X |

Fig. 11

| Module name | Module type |
|---|---|
| ModuleA | Former stage |
| ModuleB | Former stage |
| ModuleC | Latter stage |
| ModuleD | Former stage |
| ModuleE | Latter stage |

ModuleA

| Output pin name | Latency |
|---|---|
| oa1 | 4 |

ModuleB

| Output pin name | Latency |
|---|---|
| ob1 | 2 |
| ob2 | 2 |
| ob3 | 1 |

ModuleD

| Output pin name | Latency |
|---|---|
| od1 | 2 |

Fig. 19

ModuleA

| Output pin name | Latency | Number of stages of pre-optimization inserting FFs |
|---|---|---|
| oa1 | 4 | 0 |

ModuleB

| Output pin name | Latency | Number of stages of pre-optimization inserting FFs |
|---|---|---|
| ob1 | 2 | 2 |
| ob2 | 2 | 2 |
| ob3 | 1 | 1 |

ModuleD

| Output pin name | Latency | Number of stages of pre-optimization inserting FFs |
|---|---|---|
| od1 | 2 | 0 |

Fig. 20

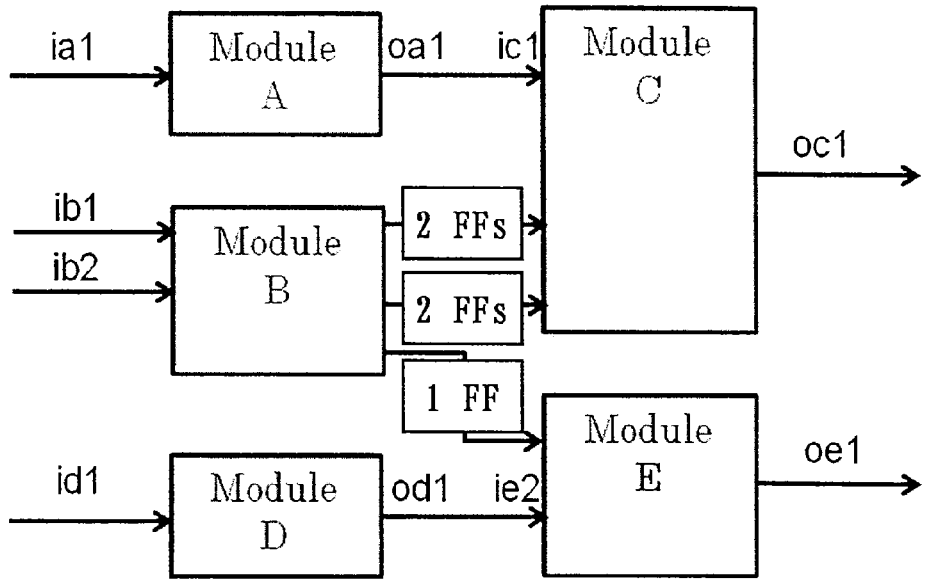

Fig. 21

ModuleA

| Output pin name | Latency | Number of stages of pre-optimization inserting FFs | Number of stages of Input Latch FFs |
|---|---|---|---|
| oa1 | 4 | 0 | 1 |

ModuleB

| Output pin name | Latency | Number of stages of pre-optimization inserting FFs | Number of stages of Input Latch FFs |
|---|---|---|---|
| ob1 | 2 | 2 | 0 |
| ob2 | 2 | 2 | 0 |
| ob3 | 1 | 1 | 0 |

ModuleD

| Output pin name | Latency | Number of stages of pre-optimization inserting FFs | Number of stages of Input Latch FFs |
|---|---|---|---|
| od1 | 2 | 0 | 0 |

Fig. 22

| from | to | Number of stages of post-optimization inserting FFs |
|------|------|---|
| ob1 | ic1 | 1 |
| ob2 | ic2 | 1 |
| ob3 | ie1 | 1 |
Fig. 23
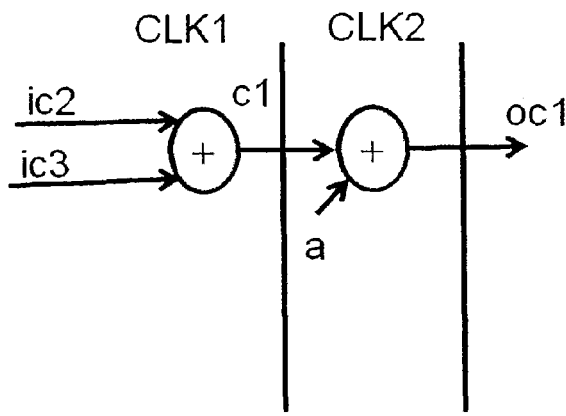
Fig. 24
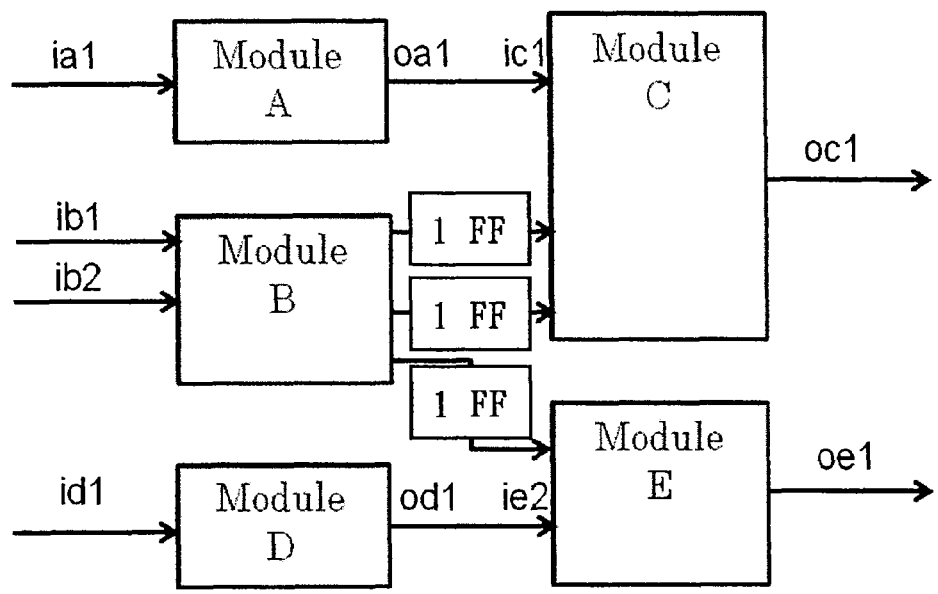
Fig. 25

| Inserting position candidate | Number of Inserting FFs | Delay (ns) |
|---|---|---|
| a | 16 | 5 |
| b | 9 | 6 |
| c | 11 | 6 |
| d | 20 | 7 |
| e | 12 | 8 |
| f | 24 | 7 |
| g | 32 | 9 |
| h | 12 | 7 |

Total FFs = 56bits
(8 + 8x2 + 2x(8x2) )

Total FFs = 40bits
(8x3 + (8x2) )

SEMICONDUCTOR INTEGRATED CIRCUIT DESIGN SUPPORTING APPARATUS, METHOD, AND PROGRAM

BACKGROUND OF THE INVENTION

1. Field of the Invention

The present invention relates to a semiconductor integrated circuit design supporting apparatus, method, and program for supporting design of a semiconductor integrated circuit, which utilizes high level synthesis or behavioral synthesis of automatically generating, based on a behavioral description of a circuit, a register transfer level (RTL) description for the semiconductor integrated circuit.

2. Description of the Related Art

Hitherto, a semiconductor integrated circuit has been designed with use of hardware description language (HDL) by RTL, which describes the behavior of combinational logic between registers (flip-flops) included in a circuit. In recent years, integrated circuits have become larger in scale, which has caused a problem in that a large amount of time is required in RTL design. In view of this, there has been proposed a technology of automatically generating an RTL description with use of high level languages such as C language, C++ language, and SystemC language, which have higher level of abstraction than that of RTL. A high level synthesis tool for realizing this technology is available.

On the other hand, there has been proposed an auxiliary design technology for realizing processing that cannot be realized by the high level synthesis tool alone. Japanese Patent Application Laid-open No. 2010-165334 (Patent Literature 1) discloses a configuration in which, in order to adjust the latency between a plurality of modules, the number of stages of flip-flops (FFs) of the modules is extracted, and then an FF is automatically inserted between the modules. Thus, the latency between the plurality of modules can be automatically adjusted.

However, the object of Patent Literature 1 is to automatically adjust the latency. Therefore, there arises a problem in that, as the entire circuit, the inserted FF is not located at an optimum position from the viewpoint of circuit scale and entire processing performance.

The case where the above-mentioned inserted FF is not located at an optimum position is considered with reference to an example of FIG. 31. FIG. 31 illustrates an example in which Module A and Module B are connected to Module C, and two FFs are inserted between Module B and Module C by the method of Patent Literature 1. Patent Literature 1 discloses that the design may be efficiently performed by extracting the latency of each module, and automatically inserting an FF for latency adjustment between the modules.

FIG. 32 illustrates an example of details inside Module C of FIG. 31. The key point is that Module C receives an input of a pin a1 by an FF. In this case, the FF inserted between Module B and Module C and the FF that is provided inside Module C and receives the input of the pin a1 may cancel each other out, and hence the number of FFs to be inserted between Module B and Module C can be reduced to one as illustrated in FIG. 33.

Another example is described. FIG. 34 is a simplified view illustrating an internal configuration and FFs of Module B. Module B performs arbitrary calculation based on a 10-bit input, and temporarily stores the calculation result by an FF of 8 bits. The result is further subjected to calculation processing, and is output by an FF of (8 bits)×2. The output of the FF of (8 bits)×2 is connected to Module C. Therefore, in this related art, when the bits of Module B and the inserted FFs are added, FFs of 56 bits are inserted, as represented by the expression in FIG. 35.

On the other hand, if it is possible to insert the FFs at positions in Module B, which have a small number of FF bits, as illustrated in FIG. 36 instead of positions between Module B and Module C, the total FFs can be reduced to 40 bits, as represented by the expression in FIG. 37.

As described above, in view of the entire circuit, the FFs inserted between the modules disclosed in Patent Literature 1 may not be located at optimum positions in terms of circuit scale.

SUMMARY OF THE INVENTION

The present invention has been made to solve the above-mentioned problem, and provides a semiconductor integrated circuit design supporting technology capable of extracting, from HDL or a synthetic log that is description language of RTL obtained through high level synthesis, a pin having an input that receives an FF, detecting a circuit state having the minimum number of FFs, detecting the FF inserting position in this circuit state, and subjecting, based on the FF inserting position, the entire circuit to high level synthesis again, to thereby automatically adjust the latency and obtain HDL that is description language of RTL representing a small circuit scale.

According to one embodiment of the present invention, there is provided a semiconductor integrated circuit design supporting apparatus, including:

latency adjusting means for calculating, based on a latency value of each module acquired from one of HDL and a synthetic log obtained from a behavioral description describing a circuit behavior through high level synthesis by high level synthesis means, a number of FFs corresponding to a necessary delay that is required to be inserted between modules;

input FF stage number acquiring means for extracting, from the one of the HDL and the synthetic log, a pin having an input that receives an FF, and acquiring a number of stages of input FFs of FF reception, which corresponds to an input delay;

latency re-adjusting means for obtaining an optimum delay based on the necessary delay from the latency adjusting means and the input delay from the input FF stage number acquiring means;

former-stage module analyzing means for detecting, based on the one of the synthetic log and the HDL, each state inside a module having a pin to be subjected to FF insertion and a state having a minimum total number of FFs held in the each state; and FF insertion optimizing synthesis means for subjecting an entire circuit to high level synthesis again by the high level synthesis means based on the optimum delay from the latency re-adjusting means and an FF inserting position obtained based on the state having the minimum total number of FFs from the former-stage module analyzing means, to thereby obtain optimized HDL.

In the semiconductor integrated circuit design supporting apparatus according to one embodiment of the present invention, the necessary delay that is required to be inserted between the modules is acquired based on the latency value of each module acquired from the HDL or the synthetic log obtained through the high level synthesis. Further, the pin having an input that receives the FF is extracted from the HDL or the synthetic log obtained through the high level synthesis, to thereby acquire the number of stages of FF reception, that is, the input delay. Then, the latency re-adjusting means obtains the optimum delay based on the necessary delay and the input delay. Then, based on the HDL or the synthetic log obtained through the high level synthesis, the total number of FFs held in each state of a module that has a pin to be subjected to FF insertion is obtained, and the state having the minimum number of FFs is detected. Then, based on the FF inserting position obtained above, the high level synthesis means subjects the entire circuit to high level synthesis again. As a result, it is possible to obtain HDL that is description language of RTL representing a small circuit scale, and hence there is such an effect that a small circuit scale hardware configuration can be obtained in a short period of time without depending on the ability of a designer.

BRIEF DESCRIPTION OF THE DRAWINGS

FIG. 6 is a diagram showing table information generated by latency re-adjusting means.

FIG. 7 is a diagram of a module configuration obtained as a result of optimizing the inter-module configuration of FIG. 3 by the latency re-adjusting means.

FIG. 8 is a diagram of a module configuration obtained as a result of optimizing the inter-module configuration of FIG. 3 by FF insertion optimizing synthesis means.

FIG. 10A is a first exemplary diagram of a behavioral description written in high level language according to the second embodiment of the present invention.

FIG. 10B is a second exemplary diagram of a behavioral description written in high level language according to the second embodiment of the present invention.

FIG. 10C is a third exemplary diagram of a behavioral description written in high level language according to the second embodiment of the present invention.

FIG. 10D is a fourth exemplary diagram of a behavioral description written in high level language according to the second embodiment of the present invention.

FIG. 11 is an exemplary diagram of a module connection list output by a module connection relationship extracting part according to the second embodiment of the present invention.

FIG. 19 is an exemplary diagram showing the latency of each output pin of a former-stage module, which is output by the provisional high level synthesis part according to the second embodiment of the present invention.

FIG. 20 is an exemplary diagram showing the number of stages of pre-optimization inserting FFs of each output pin of the former-stage module, which is calculated by a latency provisionally adjusting part according to the second embodiment of the present invention.

FIG. 21 is an exemplary diagram illustrating pre-optimization inserting FFs inserted to respective output pins of the former-stage module according to the second embodiment of the present invention.

FIG. 22 is an exemplary diagram showing the number of stages of input latch FFs calculated by an input latch FF determining part according to the second embodiment of the present invention.

FIG. 23 is an exemplary diagram showing the number of stages of post-optimization inserting FFs of each output pin of the former-stage module, which is calculated by a latency re-adjusting part according to the second embodiment of the present invention.

FIG. 24 is an exemplary diagram of a scheduling result of Module C after optimization according to the second embodiment of the present invention.

FIG. 25 is an exemplary diagram illustrating post-optimization inserting FFs inserted to respective output pins of the former-stage module according to the second embodiment of the present invention.

DETAILED DESCRIPTION OF THE PREFERRED EMBODIMENTS

First Embodiment

A semiconductor integrated circuit design supporting apparatus according to one embodiment of the present invention includes a computer main body, a graphic display device, a keyboard, a mouse, a compact disc read-only memory (CD-ROM) device to which a CD-ROM is mounted, and a network.

A semiconductor integrated circuit design supporting program is supplied by means of a storage medium such as a CD-ROM, and is executed by the computer main body. An operator operates the keyboard or the mouse while looking at the graphic display device so as to control the semiconductor integrated circuit design supporting program to support design of a semiconductor integrated circuit.

Further, the semiconductor integrated circuit design supporting program may be supplied to the computer main body via the network from another computer through a communication line.

The computer main body includes a central processor unit (CPU), a read-only memory (ROM), a random access memory (RAM), and a hard disk. The CPU performs processing while inputting or outputting data with respect to the graphic display device, the keyboard, the mouse, the CD-ROM device, the network, the ROM, the RAM, or the hard disk.

The CPU controls the semiconductor integrated circuit design supporting program stored in the CD-ROM to be temporarily stored in the hard disk via the CD-ROM device. The CPU appropriately loads the semiconductor integrated circuit design supporting program from the hard disk to the RAM to execute the semiconductor integrated circuit design supporting program. Thus, semiconductor integrated circuit design support is performed.

Figure 1:
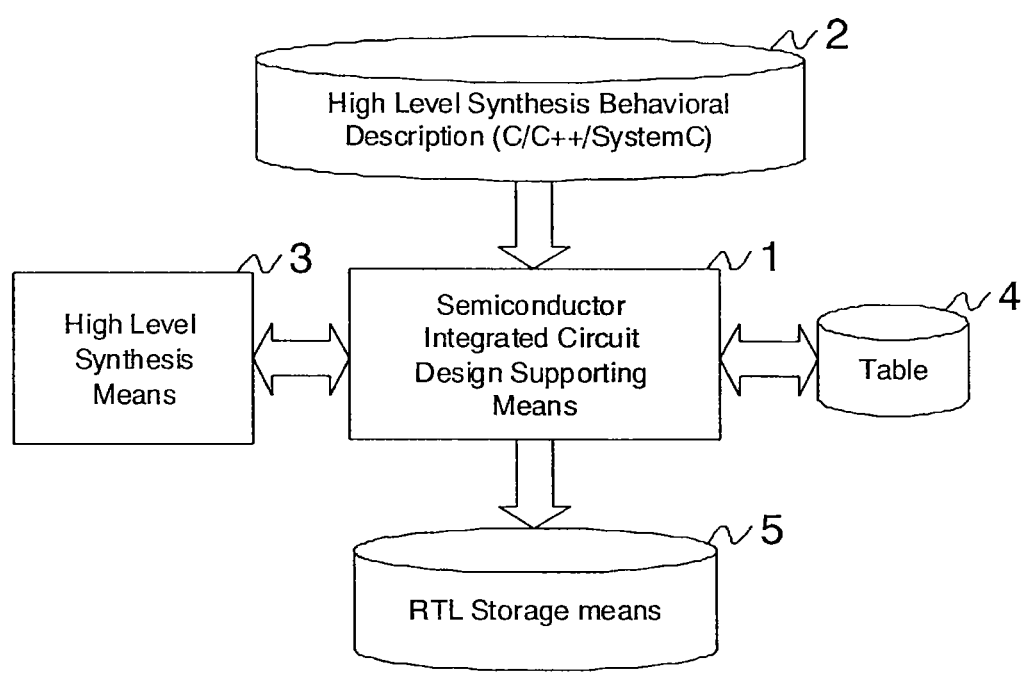
FIG. 1 is a functional block diagram of a semiconductor integrated circuit design supporting apparatus according to a first embodiment of the present invention.

FIG. 1 is a functional block diagram illustrating the function of the semiconductor integrated circuit design supporting apparatus according to a first embodiment of the present invention. In FIG. 1, in response to the input of a behavioral description for high level synthesis, which is written in high level language (such as C language, C++ language, and SystemC language), from high level synthesis behavioral description storing means 2, semiconductor integrated circuit design supporting means 1 converts the behavioral description into a high-performance RTL description with use of high level synthesis means 3 and a table 4, and stores the converted RTL description in RTL storage means 5.

Now, the high level language for high level synthesis is described. Generally, a code written in high level language needs to be rewritten so as to enable high level synthesis by a high level synthesis tool. "Rewrite" means an operation of deleting, from the code, a description that cannot be synthesized due to restrictions of the high level synthesis tool or rewriting the description to a synthesizable description, and an operation of changing the description to a code considering the architecture.

The semiconductor integrated circuit design supporting means 1 receives a code that describes the behavior of a circuit to be subjected to high level synthesis, such as C language, C++ language, and SystemC language, from the high level synthesis behavioral description storing means 2, and designs the arrangement of FFs for latency adjustment between a plurality of modules so that the circuit scale is reduced as much as possible in cooperation with the high level synthesis means 3. In order to realize this arrangement design, the semiconductor integrated circuit design supporting apparatus according to the first embodiment includes the table 4 for storing processing results and the high level synthesis means 3.

Figure 2:
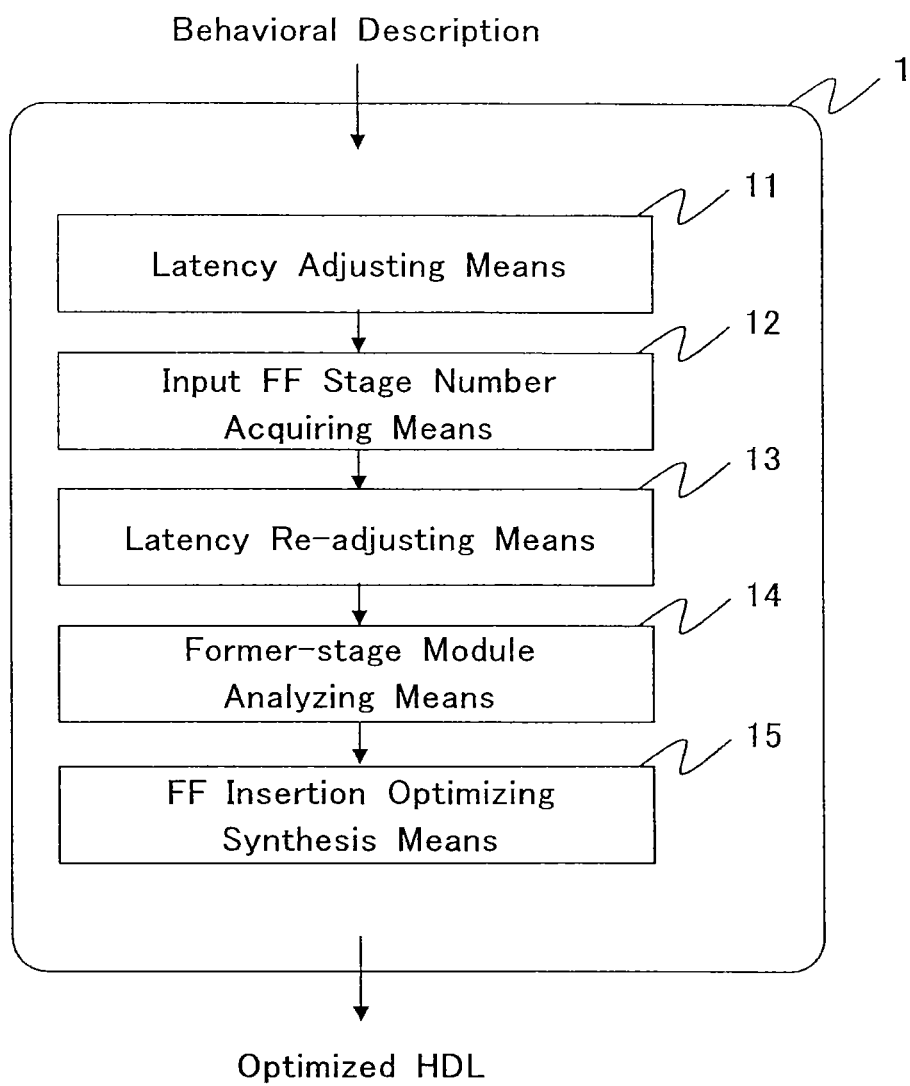
FIG. 2 is a functional block diagram illustrating an internal configuration of semiconductor integrated circuit design supporting means in FIG. 1.

The semiconductor integrated circuit design supporting means 1 includes, as illustrated in FIG. 2, latency adjusting means 11, input FF stage number acquiring means 12, latency re-adjusting means 13, former-stage module analyzing means 14, and FF insertion optimizing synthesis means 15.

Figures 3, 4, 5:
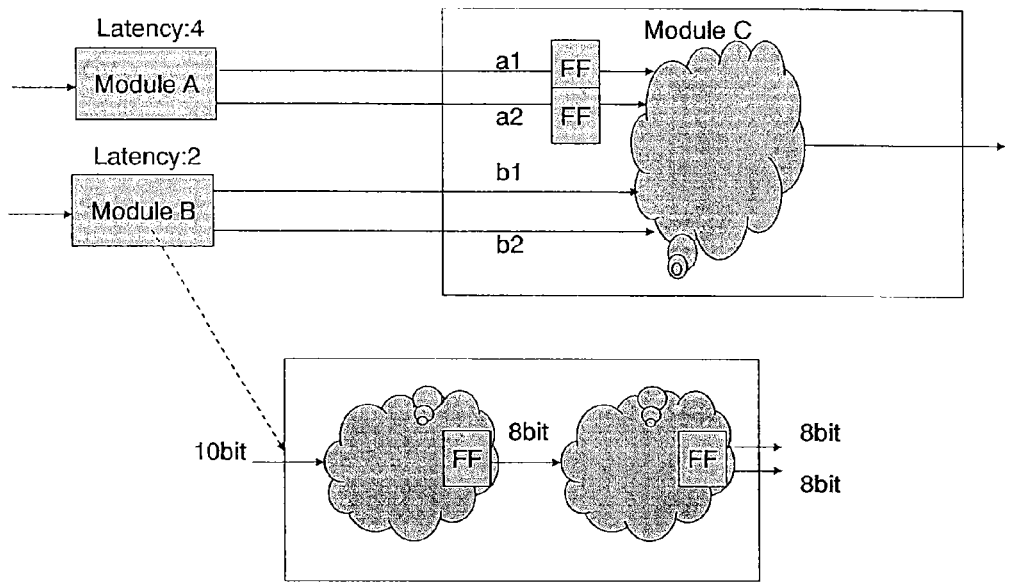
FIG. 3 is a diagram of an inter-module configuration, which illustrates an application example of the first embodiment of the present invention.
FIG. 4 is a diagram showing table information generated by latency adjusting means.
FIG. 5 is a diagram showing table information generated by input FF stage number acquiring means.

FIG. 3 is a diagram of a module configuration to which the semiconductor integrated circuit design supporting apparatus according to the first embodiment is applied.

Next, the operation of the first embodiment in the case of the module configuration diagram of FIG. 3 is described with reference to FIG. 2.

The respective means configuring the semiconductor integrated circuit design supporting means 1 illustrated in FIG. 2 each exchange data with respect to the table 4 and the high level synthesis means 3 as necessary.

Step 1: Latency Adjustment

The latency adjusting means 11 receives, as an input, a behavioral description from the high level synthesis behavioral description storing means 2, and performs high level synthesis in each module defined in the behavioral description with the high level synthesis means 3 to obtain HDL or a synthetic log. Then, the latency adjusting means 11 acquires the latency of each module based on this synthesis result, and calculates the number of FFs that is required to be inserted between the modules. FIG. 4 shows an example of data output from the latency adjusting means 11, and this data is written to the table 4. Note that, this step is processing similar to that in the related art.

Step 2: Input FF Stage Number Acquisition

Next, based on the synthesized HDL or the synthetic log, the input FF stage number acquiring means 12 extracts pins whose inputs are supposed to receive FFs, acquires the number of stages of FF reception, and creates data shown in FIG. 5. This data is written to the table 4.

Step 3: Latency Re-Adjustment

The latency re-adjusting means 13 calculates the optimum number of necessary delays based on the necessary latency obtained by the latency adjusting means 11 and the number of stages of input FFs obtained by the input FF stage number acquiring means 12. In each pin connection, the optimum delay is determined based on the following calculation expressions:

each pre-optimization delay=each necessary delay+ each input delay(number of stages of input FFs);

number of redundant FFs=min(each pre-optimization delay); and each optimum delay=each necessary delay−redundant FF.

With the above-mentioned calculation, results as shown in FIG. 6 are obtained, and those results are written to the table 4. Note that, the optimum delay is determined in this step, and hence, when this case is applied, as illustrated in FIG. 7, the number of FFs can be reduced in the entire circuit as compared to FIG. 3.

Step 4: Former-Stage Module Analysis

Step 4 is applied to a module having output pins to be subjected to FF insertion. In this embodiment, Module B corresponds to this module. In the related art, an FF is inserted to the output of Module B. However, in this step, the former-stage module analyzing means 14 extracts where to insert the FF to achieve the minimum number of FFs in a plurality of states that do not affect the function. Specifically, based on the synthetic log or the HDL obtained from the behavioral description through high level synthesis by the high level synthesis means, each state inside Module B and the number of FFs held in the each state are listed. In this case, the "state" refers to a state meaning state transition. Even in a pipelined circuit in which there is actually no HDL state transition, each state is defined between FFs. In each state, a part at which the state can be copied is selected. Whether or not the state can be copied depends on whether normal operation is secured even when the state is copied, except for extension of the latency of the circuit.

In the above, the state may be extracted from a high level synthesis log or a behavioral description code. In each state in which the extracted state can be copied, the total number of held FFs is determined, and the state having the minimum number of FFs is detected.

Step 5: FF Insertion Optimization

Based on the FF inserting positions obtained in Step 3 and Step 4, the FF insertion optimizing synthesis means 15 subjects the entire circuit to high level synthesis again, and obtains an optimized HDL, which is stored in the RTL storage means 5. FIG. 8 illustrates a schematic view of the optimized FF configuration.

Second Embodiment

Next, a semiconductor integrated circuit design supporting apparatus according to a second embodiment of the present invention is described. The configuration of the semiconductor integrated circuit design supporting apparatus according to the second embodiment of the present invention is the same as that in FIG. 1.

The semiconductor integrated circuit design supporting means 1 illustrated in FIG. 1 inputs a behavioral description code (hereinafter simply referred to as "behavioral description") of an integrated circuit, which is written in high level language (such as C language, C++ language, and SystemC language) from the high level synthesis behavioral description storing means 2. Then, in cooperation with the high level synthesis means 3 that executes high level synthesis of analyzing the behavioral description to generate an RTL description, the semiconductor integrated circuit design supporting means 1 generates the RTL description and outputs the RTL description to the RTL storage means 5.

At this time, the semiconductor integrated circuit design supporting means 1 utilizes the table 4 as a temporal storage region of processing results generated in the process of high level synthesis. Further, the semiconductor integrated circuit design supporting means 1 optimizes the inserting positions and the number of inserting stages of FFs to be inserted into the RTL by the high level synthesis. In this manner, the circuit scale of the entire integrated circuit is reduced and the processing efficiency of the entire integrated circuit is improved.

The semiconductor integrated circuit design supporting means 1 illustrated in FIG. 1 includes, for example, a computer main body, a graphic display device, a keyboard, a mouse, a compact disc read-only memory (CD-ROM) device to which a CD-ROM is mounted, and a network.

The computer main body includes, for example, a central processor unit (CPU), a read-only memory (ROM), a random access memory (RAM), and a hard disk. The CPU performs processing while inputting or outputting data with respect to the graphic display device, the keyboard, the mouse, the CD-ROM device, the network, the ROM, the RAM, or the hard disk.

Further, the semiconductor integrated circuit design supporting program for causing the computer main body to function as the semiconductor integrated circuit design supporting apparatus is, for example, supplied by means of a storage medium such as a CD-ROM, and is executed by the computer main body. An operator operates the keyboard or the mouse while looking at the graphic display device so as to control the semiconductor integrated circuit design supporting program to support design of an integrated circuit. The semiconductor integrated circuit design supporting program may be supplied to the computer main body via the network from another computer through a communication line.

For example, the CPU controls the semiconductor integrated circuit design supporting program stored in the CD-ROM to be temporarily stored in the hard disk via the CD-ROM device. The CPU appropriately loads the semiconductor integrated circuit design supporting program from the hard disk to the RAM to execute the semiconductor integrated circuit design supporting program. Thus, semiconductor integrated circuit design support is performed.

Further, the high level synthesis means 3 illustrated in FIG. 1 is a device configured to execute high level synthesis (or behavioral synthesis) of analyzing the behavioral description written in high level language, generating a control/data-flow graph and performing scheduling processing, and generating a RTL description. When performing the high level synthesis, the high level synthesis means 3 outputs, as an intermediate result, a scheduling result including the latency of each output pin of each module and information on delay between signal lines at each clock boundary in each module. Further, the high level synthesis means 3 can generate the target RTL description based on the scheduling results corresponding to the intermediate results.

Figure 9:
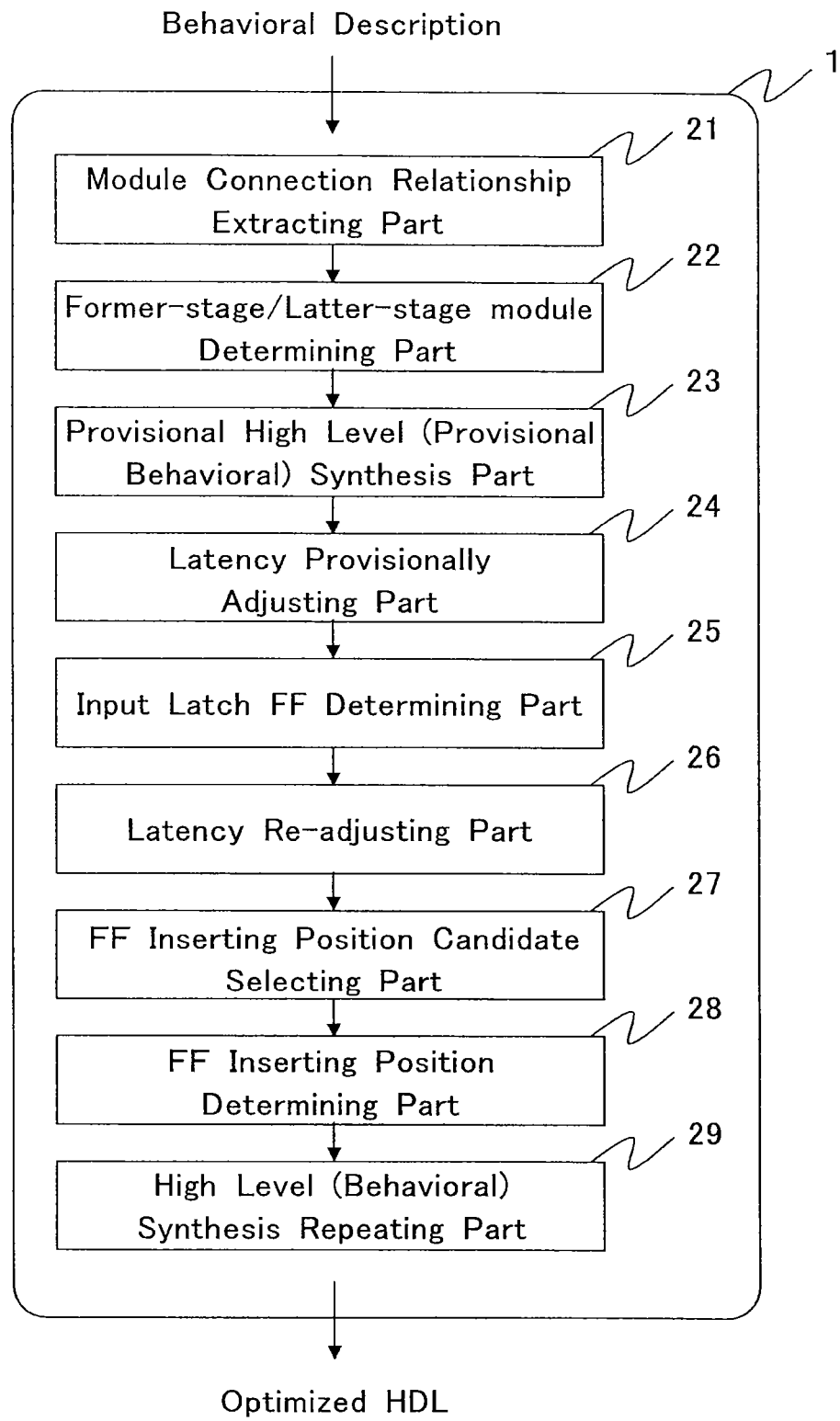
FIG. 9 is an exemplary diagram of a configuration of a semiconductor integrated circuit design supporting apparatus according to a second embodiment of the present invention.

Next, the internal configuration of the semiconductor integrated circuit design supporting means 1 is described. FIG. 9 is an exemplary diagram of the configuration of the semiconductor integrated circuit design supporting means 1 according to the second embodiment of the present invention. The semiconductor integrated circuit design supporting means 1 illustrated in FIG. 9 includes a module connection relationship extracting part 21, a former-stage/latter-stage module determining part 22, a provisional high level synthesis part 23, a latency provisionally adjusting part 24, an input latch FF determining part 25, a latency re-adjusting part 26, an FF inserting position candidate selecting part 27, an FF inserting position determining part 28, and a high level synthesis repeating part 29. Those components included in the semiconductor integrated circuit design supporting means 1 each exchange data with respect to the table 4 and the high level synthesis means 3 as necessary. The functions of the respective components are specifically described below.

Step 1: Module Connection Relationship Extracting Step

The module connection relationship extracting part 21 extracts connection relationships among respective modules in an integrated circuit, which are described in a behavioral description input from the high level synthesis behavioral description storing means 2, and writes the result to the table 4 as a module connection list. At this time, the module connection relationship extracting part 21 writes, as the module connection list, information including, regarding each module, the name of the input/output pin, the module name as a connection source and the connected pin name in the case of an input pin, and the module name as a connection destination and the connected pin name in the case of an output pin.

Figure 12:
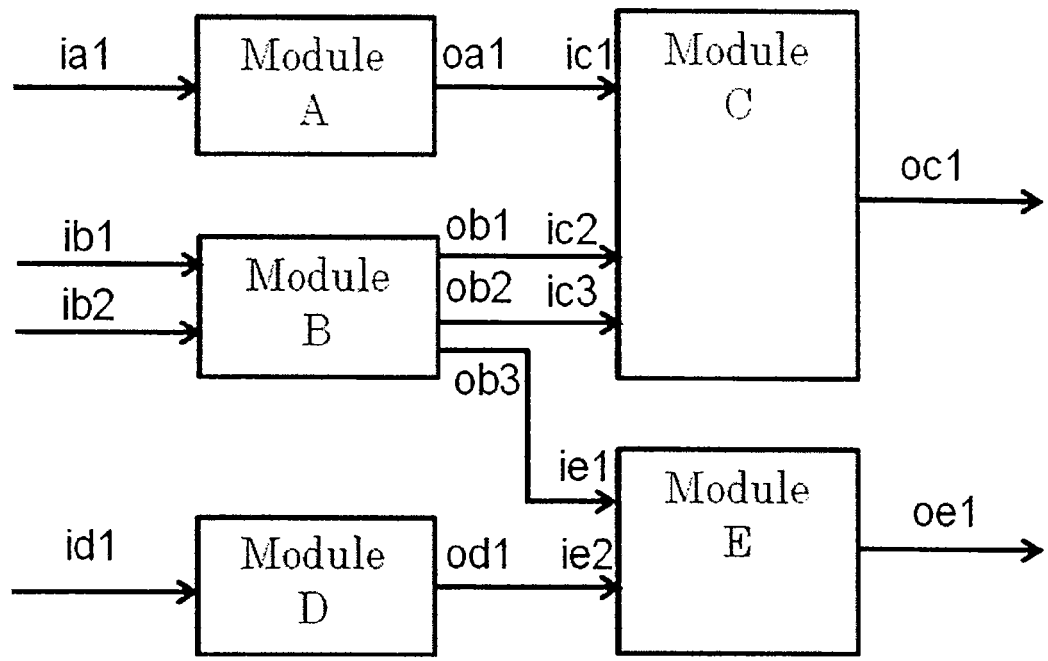
FIG. 12 is a block diagram illustrating connection relationships among respective modules shown in the module connection list of FIG. 11.

FIGS. 10A to 10D are exemplary diagrams of a behavioral description written in high level language according to the second embodiment of the present invention. Further, FIG. 11 is an exemplary diagram of the module connection list output by the module connection relationship extracting part 21 according to the second embodiment of the present invention. Further, FIG. 12 is a block diagram illustrating the connection relationships among respective modules shown in the module connection list of FIG. 11.

The module connection list shown in FIG. 11 is a module connection list output by the module connection relationship extracting part 21 when the behavioral description shown in FIGS. 10A to 10D is input. In this case, a part of the module connection list shown in FIG. 11, which is independent of the second embodiment, is represented as "X". Further, FIG. 12 is a block diagram illustrating connection relationships among respective modules in order to facilitate understanding of the module connection list shown in FIG. 11.

Step 2: Former-Stage/Latter-Stage Module Determining Step

The former-stage/latter-stage module determining part 22 analyzes whether each module in the module connection list output by the module connection relationship extracting part 21 is a former-stage module or a latter-stage module.

In this case, the latter-stage module refers to a module that receives (is connected to) output pins of a plurality of modules as input pins. Further, the former-stage module refers to a module having an output pin connected to the input pin of the latter-stage module. Unless a module connected to the former-stage module is a latter-stage module, the module is treated as a former-stage module. Further, one latter-stage module and a plurality of former-stage modules connected thereto are defined as a minimum analysis unit.

The former-stage/latter-stage module determining part 22 reads the module connection list from the table 4, and defines the latter-stage module and the former-stage module as follows. In the module connection list, a module having a plurality of difference modules defined in a "from" section indicating a module connected to the input pin is defined as the latter-stage module, and the module that becomes an input of the latter-stage module is defined as the former-stage module. Along with this definition, a determined former-stage/latter-stage module list is written to the table 4.

Figure 13:
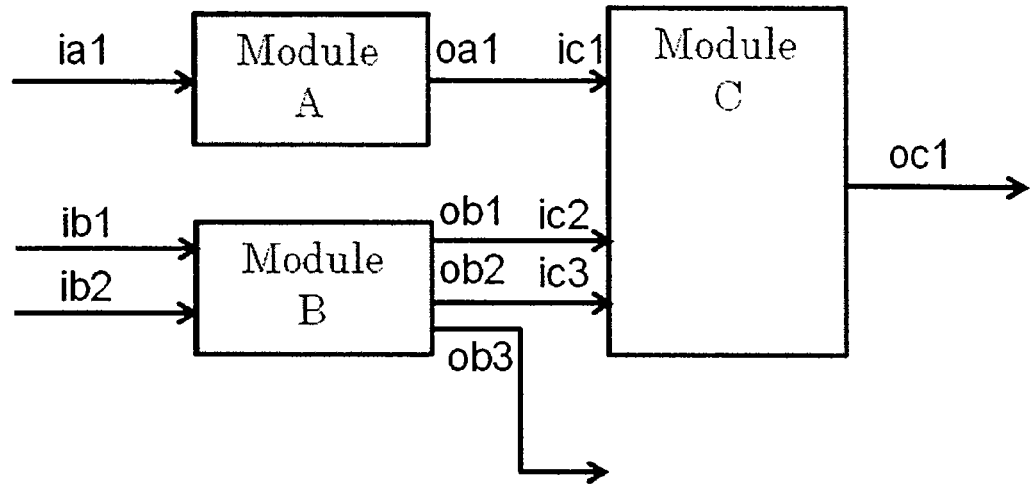
FIG. 13 is an exemplary diagram of a configuration of a minimum analysis unit including Module C as a latter-stage module according to the second embodiment of the present invention.
Figures 14, 15:
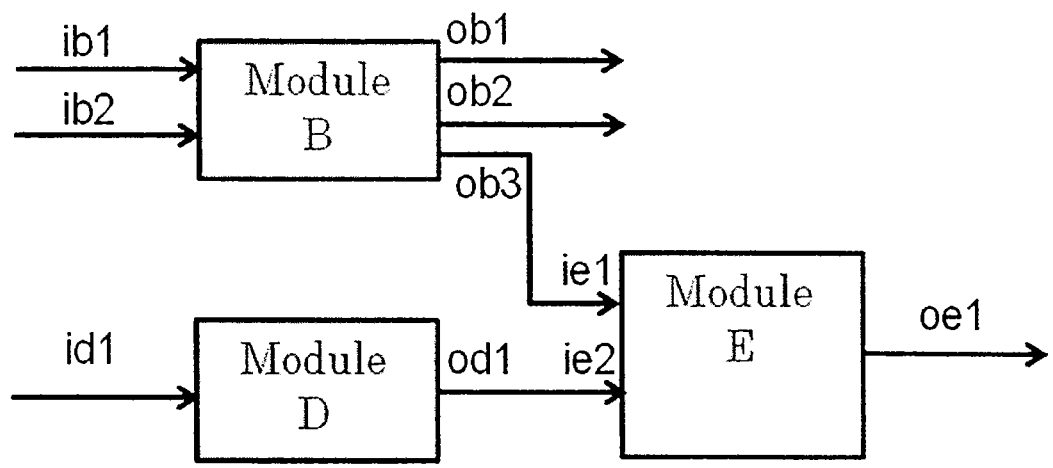
FIG. 14 is an exemplary diagram of a configuration of a minimum analysis unit including Module E as a latter-stage module according to the second embodiment of the present invention.
FIG. 15 is an exemplary diagram of a former-stage/latter-stage module list output by a former-stage/latter-stage module determining part according to the second embodiment of the present invention.

FIG. 13 is an exemplary diagram of the configuration of the minimum analysis unit including Module C as the latter-stage module according to the second embodiment of the present invention. Further, FIG. 14 is an exemplary diagram of the configuration of the minimum analysis unit including Module E as the latter-stage module according to the second embodiment of the present invention. Further, FIG. 15 is an exemplary diagram of the former-stage/latter-stage module list output by the former-stage/latter-stage module determining part 22 according to the second embodiment of the present invention.

When the module connection list shown in FIG. 11 is input, as shown in FIG. 15, Module A, Module B, and Module D become former-stage modules, and Module C and Module E become latter-stage modules. Further, the latter-stage module C, and the former-stage module A and the former-stage module B connected to the latter-stage module C illustrated in FIG. 13 constitute the minimum analysis unit. Further, similarly, the latter-stage module E, and the former-stage module B and the former-stage module D connected to the latter-stage module E illustrated in FIG. 14 constitute the minimum analysis unit.

Next, a latency adjusting method in the minimum analysis unit including Module C as the latter-stage module illustrated in FIG. 13, and the minimum analysis unit including Module E as the latter-stage module illustrated in FIG. 14 is described below. Note that, the module to be subjected to latency adjustment may be designated by a user from the outside.

Step 3: Provisional High Level Synthesis Step

The provisional high level synthesis part 23 reads the former-stage/latter-stage module list from the table 4, and subjects the latter-stage module and the former-stage modules of each minimum analysis unit, which are designated in the former-stage/latter-stage module list, to high level synthesis in cooperation with the high level synthesis means 3. Then, the provisional high level synthesis part 23 writes, to the table 4, a scheduling result including the latency of each output pin of each module and delay information (critical path) between signal lines at each clock boundary in each module, which corresponds to an intermediate result of the high level synthesis.

Figure 16:
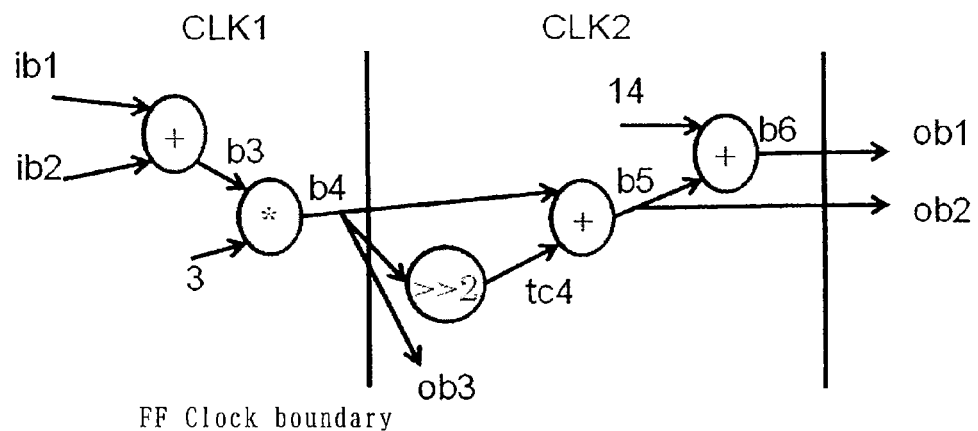
FIG. 16 is an exemplary diagram of a scheduling result of Module B, which is output by a provisional high level synthesis part according to the second embodiment of the present invention.
Figure 17:
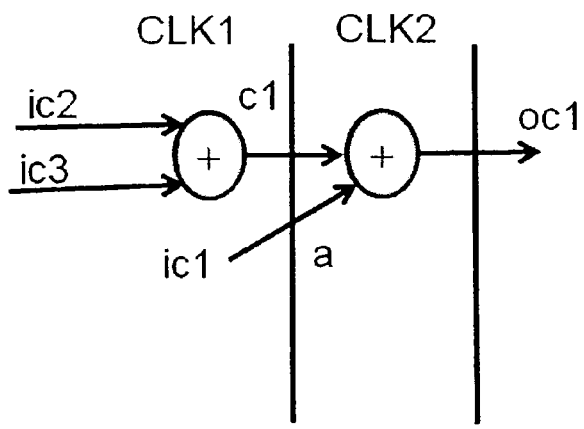
FIG. 17 is an exemplary diagram of a scheduling result of Module C, which is output by the provisional high level synthesis part according to the second embodiment of the present invention.
Figure 18:
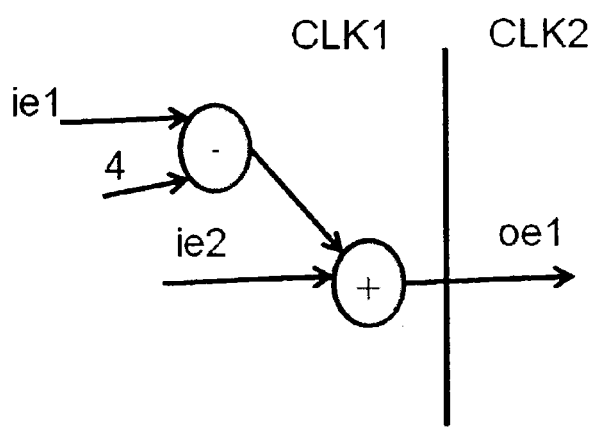
FIG. 18 is an exemplary diagram of a scheduling result of Module E, which is output by the provisional high level synthesis part according to the second embodiment of the present invention.

FIG. 16 is an exemplary diagram of a scheduling result of Module B, which is output by the provisional high level synthesis part 23 according to the second embodiment of the present invention. FIG. 17 is an exemplary diagram of a scheduling result of Module C, which is output by the provisional high level synthesis part 23 according to the second embodiment of the present invention. FIG. 18 is an exemplary diagram of a scheduling result of Module E, which is output by the provisional high level synthesis part 23 according to the second embodiment of the present invention.

FIGS. 16 to 18 illustrate outputs of the provisional high level synthesis part 23 in a case where the behavioral description shown in FIGS. 10A to 10D is input. Note that, FIGS. 16 to 18 omit illustration of parts independent of the second embodiment. The vertical lines in FIGS. 16 to 18 each represent a clock boundary, and FFs are inserted at those positions.

FIG. 19 is an exemplary diagram showing the latency of each output pin of the former-stage module, which is output by the provisional high level synthesis part 23 according to the second embodiment of the present invention. As shown in FIG. 19, the processing latency included in the scheduling result is written as the latency of each output pin of the former-stage module.

Step 4: Latency Provisionally Adjusting Step

The latency provisionally adjusting part 24 reads the scheduling results from the table 4, and writes, to the table 4, a value obtained by subtracting a value of the latency of each former-stage module from the maximum pre-optimization latency corresponding to the largest latency value among the former-stage modules in each minimum analysis unit, as the number of stages of pre-optimization inserting FFs.

FIG. 20 is an exemplary diagram showing the number of stages of pre-optimization inserting FFs of each output pin of the former-stage module, which is calculated by the latency provisionally adjusting part 24 according to the second embodiment of the present invention. Further, FIG. 21 is an exemplary diagram illustrating pre-optimization inserting FFs inserted to respective output pins of the former-stage module according to the second embodiment of the present invention.

In the case of the processing latency shown in FIG. 19, the number of stages of pre-optimization inserting FFs calculated by the latency provisionally adjusting part 24 is as shown in FIG. 20. As a result, it is possible to determine how many stages of pre-optimization inserting FFs are necessary between the respective modules for latency adjustment. When the number of stages of pre-optimization inserting FFs is determined, as illustrated in FIG. 21, the object of adjusting the latency by inserting the pre-optimization inserting FF between the modules can be achieved.

In the second embodiment, the inside of the module is further analyzed, to thereby optimize the inserting position of the pre-optimization inserting FF so as to achieve improvement in terms of circuit scale or speed (operating frequency). This optimization method is described below.

Step 5: Input Latch FF Determining Step

The input latch FF determining part 25 reads the scheduling results from the table 4, and calculates how many input latch pins are present in the latter-stage module in each minimum analysis unit. In this case, the input latch pin refers to an input pin of the latter-stage module, which is latched by an FF without interposing logic. The input latch FF determining part 25 determines, based on the scheduling results, a pin as the input latch pin when the input pin exceeds a clock boundary without interposing logic.

Further, when input latch FFs that are FFs latching the input latch pins are provided in number of stages so as to cross a plurality of clock boundaries, the input latch FF determining part 25 counts the number of boundaries. The input latch FF determining part 25 writes the counted number to the table 4 as the number of stages of input latch FFs.

FIG. 22 is an exemplary diagram showing the number of stages of input latch FFs calculated by the input latch FF determining part 25 according to the second embodiment of the present invention. As shown in FIG. 22, the input latch FF determining part 25 writes, to the table 4, the number of stages of input latch FFs of the input pin of the latter-stage module connected to each output pin of the former-stage module.

Step 6: Latency Re-Adjusting Step

The latency re-adjusting part 26 subtracts the value of the number of stages of input latch FFs from the maximum pre-optimization latency in the input pin of the latter-stage module, which is connected to the pin having the maximum number of pre-optimization latencies, in each minimum analysis unit. The obtained value corresponds to the maximum post-optimization latency. Next, each latency of the output pin of the former-stage module is subtracted from the maximum post-optimization latency. This number corresponds to the number of stages of post-optimization inserting FFs.

The latency re-adjusting part 26 writes this value to the table 4. In this case, the pin to be subjected to latency adjustment is referred to as "latency adjusting pin".

Next, the scheduling result of the latter-stage module having the input latch FF to be cancelled out is read out from the table 4, and the cancelled input latch FF is deleted. Then, the scheduling result is written back to the table 4, and thus the scheduling result is updated.

Specifically, in the minimum analysis unit including Module C as the latter-stage module illustrated in FIG. 13, the maximum pre-optimization latency is 4, and the number of stages of input latch FFs is 1. Therefore, the maximum post-optimization latency is 3. Further, in the minimum analysis unit including Module E as the latter-stage module illustrated in FIG. 14, the maximum pre-optimization latency is 2, and the number of stages of input latch FFs is 0. Therefore, the maximum post-optimization latency is 2.

FIG. 23 is an exemplary diagram showing the number of stages of post-optimization inserting FFs of each output pin of the former-stage module, which is calculated by the latency re-adjusting part 26 according to the second embodiment of the present invention. By subtracting each latency of the output pin of the former-stage module from the maximum post-optimization latency calculated as described above, the number of stages of post-optimization inserting FFs of Module B can be calculated as shown in FIG. 23.

FIG. 24 is an exemplary diagram of a scheduling result of Module C after the optimization according to the second embodiment of the present invention. Further, FIG. 25 is an exemplary diagram illustrating post-optimization inserting FFs inserted to respective output pins of the former-stage module according to the second embodiment of the present invention. As illustrated in FIG. 24, the number of stages of pre-optimization inserting FFs of Module C is cancelled out with the number of stages of input latch FFs after the optimization, and is reduced by one stage. As a result, the post-optimization inserting FFs inserted between the modules are as illustrated in FIG. 25.

Step 7: FF Inserting Position Candidate Selecting Step

The FF inserting position candidate selecting part 27 analyzes positions in the latter-stage module and the former-stage modules of each minimum analysis unit, which enable achievement of the same timing and function between the case where the pre-optimization inserting FF is inserted between the modules and the case where an FF is inserted at an arbitrary position inside the module as viewed from the input and output of each minimum analysis unit.

First, the FF inserting position candidate selecting part 27 reads out the scheduling results of the latter-stage module and the former-stage module from the table 4, and integrates the scheduling results.

Figure 26:
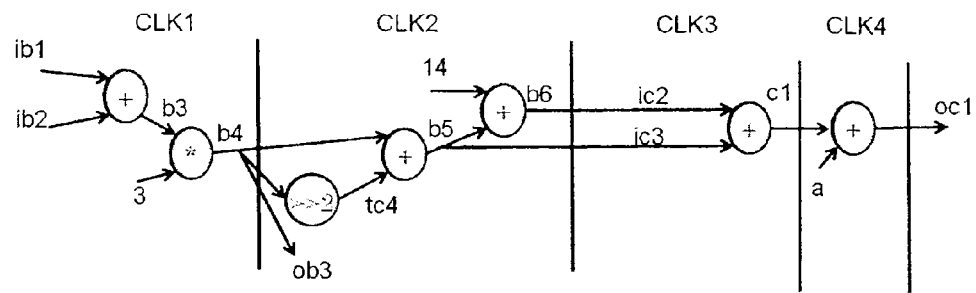
FIG. 26 illustrates an integrated scheduling result in the minimum analysis unit illustrated in FIG. 13 according to the second embodiment of the present invention.

FIG. 26 illustrates an integrated scheduling result in the minimum analysis unit illustrated in FIG. 13 according to the second embodiment of the present invention. Further, FIG. 27 illustrates an integrated scheduling result in the minimum analysis unit illustrated in FIG. 14 according to the second embodiment of the present invention.

Figure 27:
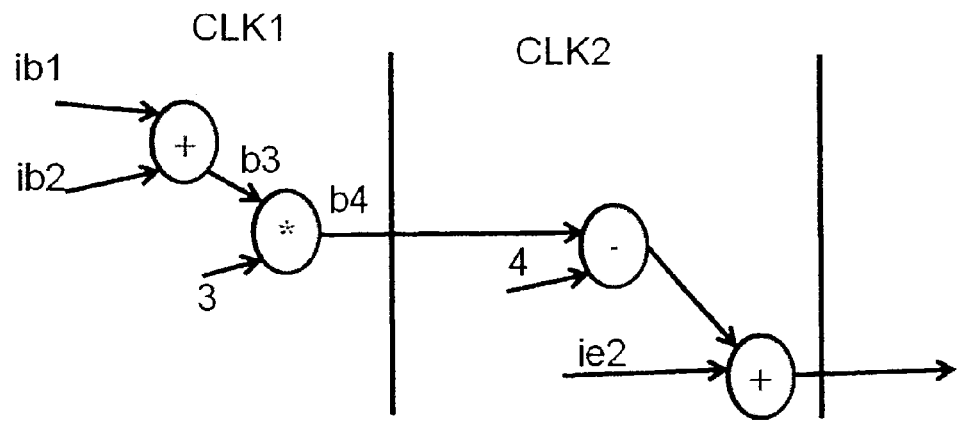
FIG. 27 illustrates an integrated scheduling result in the minimum analysis unit illustrated in FIG. 14 according to the second embodiment of the present invention.
Figure 28:
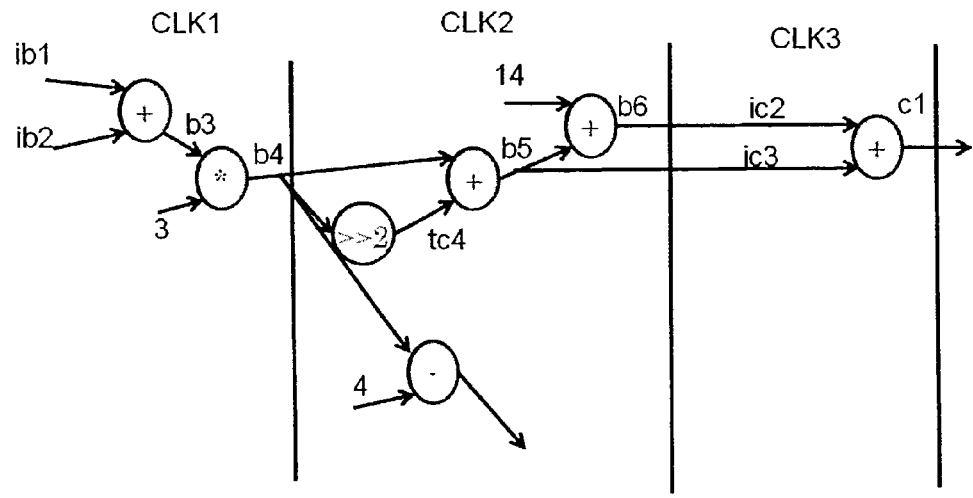
FIG. 28 illustrates an integrated scheduling result obtained by further integrating the integrated scheduling result illustrated in FIG. 26 and the integrated scheduling result illustrated in FIG. 27 according to the second embodiment of the present invention.

Further, FIG. 28 illustrates an integrated scheduling result obtained by further integrating the integrated scheduling result illustrated in FIG. 26 and the integrated scheduling result illustrated in FIG. 27 according to the second embodiment of the present invention. Based on the integrated scheduling result obtained by further integrating the integrated scheduling results of the respective minimum analysis units as illustrated in FIG. 28, candidates of the FF inserting positions are determined. In this case, a position between modules at which an FF is inserted in the related art is referred to as "inter-module FF inserting clock boundary".

First, the integrated scheduling result is analyzed from the back, in other words, the clock boundary having the largest number, such as CKL4 in FIG. 26.

In this case, a signal line other than the latency adjusting pin is referred to as "unrelated pin". A signal line generated from the latency adjusting pin interposing logic is referred to as "derived signal line". When the logic is executed by a signal of merely the derived signal line, a signal of its output also becomes a derived signal line. Further, a signal line generated from the derived signal line and a signal line other than the derived signal line and the latency adjusting pin is referred to as "unrelated signal line".

A scheduling result after the logic generated by the unrelated signal line or the unrelated pin and the latency adjusting pin or the derived signal line is outside an FF inserting candidate range.

In the example of FIG. 26, a signal "a" is an unrelated signal line, and c1 is a derived signal line. The scheduling result after the adding processing generated by those signal lines is outside the FF inserting candidate range. Further, ie1 is a derived signal line, and ie2 is an unrelated pin. The scheduling result after the adding logic generated by those signal lines is outside the FF inserting candidate range. This point is set as an end point of the FF inserting candidate range.

Further, an input signal line of the logic generating the latency adjusting pin is referred to as "parent signal line" (b5 in FIG. 26). The parent signal line appears in front of a module, and hence is limited to the former-stage module. An input signal of logic generating the parent signal line is also a parent signal line, and the parent signal line is defined until an input signal of the module (tc4, b4, b3, ib1, and ib2 in FIG. 26). An output signal of logic inputting the parent signal line is a child signal line as viewed from the parent signal line (in FIG. 26, tc4 is the parent signal line, and b5 is the child signal line as viewed from tc4). As described above, a tree-shaped parent-child relationship is extracted.

The tree topmost parent signal line having an output pin other than the latency adjusting pin as a child is defined as an outside output signal line (b4 in FIG. 26).

In each unit to be analyzed, the outside output signal line is extracted (in this example, b4). An appearing point of the outside output signal line (when no outside output signal appears, the input signal pin of the former-stage module) is defined as a start point of the FF inserting candidate range.

In this case, when the outside output signal line is the same in the respective units to be analyzed, and when the latency adjusting pin is present, in other words, at least one FF inserting position for latency adjustment is present, the outside output signal line is deleted, and the outside output signal line is defined again in the former stage. In other words, in the case of this example, b4 is the same, and the latency adjusting pin is present in each unit. Therefore, the outside output signal line of b4 is deleted, and the analysis is performed on the former stage. As a result, ib1 and ib2 become the start points.

As described above, the end point and the start point can be determined based on the scheduling results. The candidates of the clock boundary to be added are extracted in this range.

Figures 29, 30:
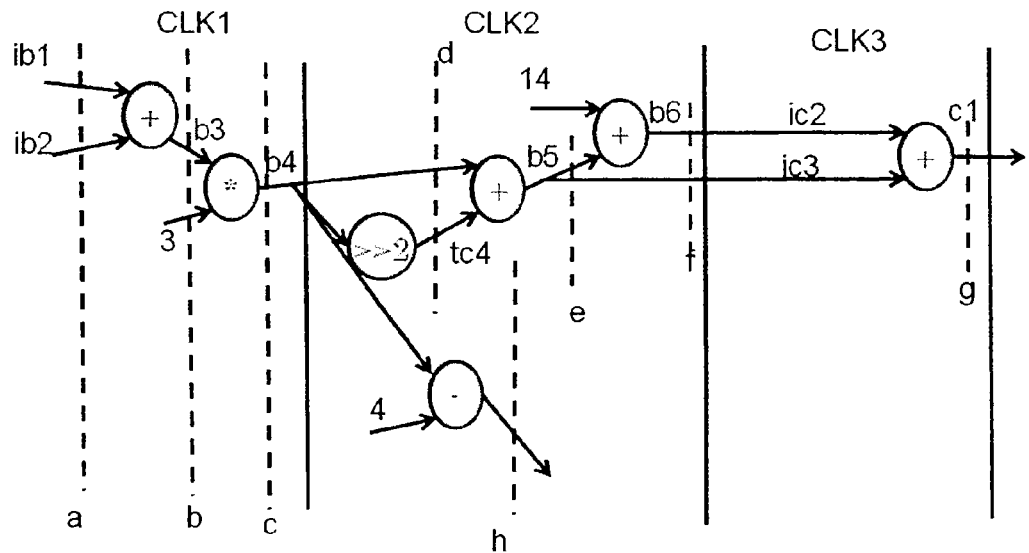
FIG. 29 illustrates a scheduling result showing candidates of an inserting position of a post-optimization inserting FF, which is calculated by an FF inserting position candidate selecting part according to the second embodiment of the present invention.
FIG. 30 shows the number of FFs and delay information in each inserting position candidate for the post-optimization inserting FF according to the second embodiment of the present invention.
Figure 31:
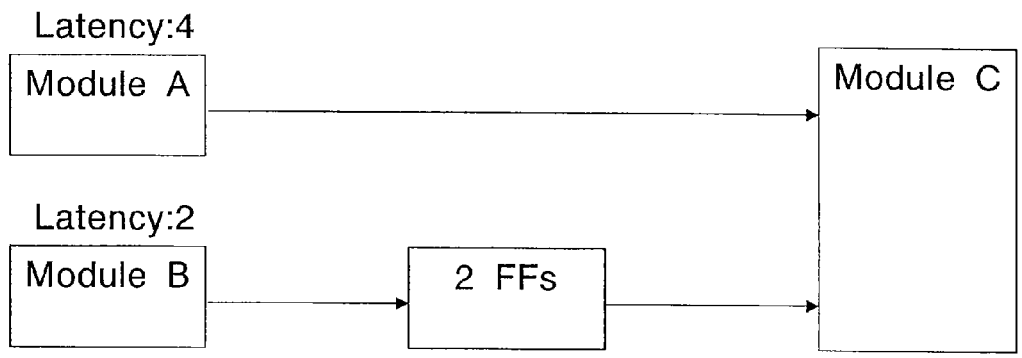
FIG. 31 is a diagram of a configuration in which FFs are inserted between modules according to the related art.
Figure 32:
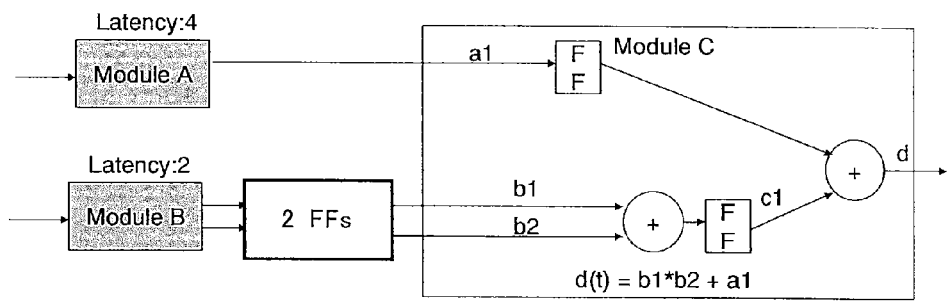
FIG. 32 is a diagram illustrating an internal configuration of Module C in FIG. 31.
Figure 33:
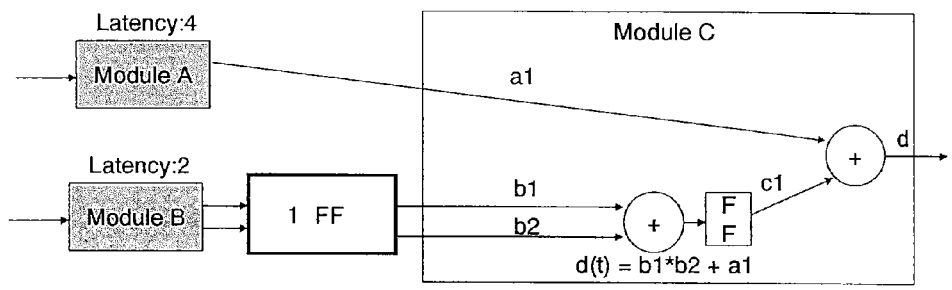
FIG. 33 is a diagram illustrating the internal configuration of Module C in FIG. 31 and a result of canceling between an FF at a pin a1 and an inserted FF.
Figure 34:
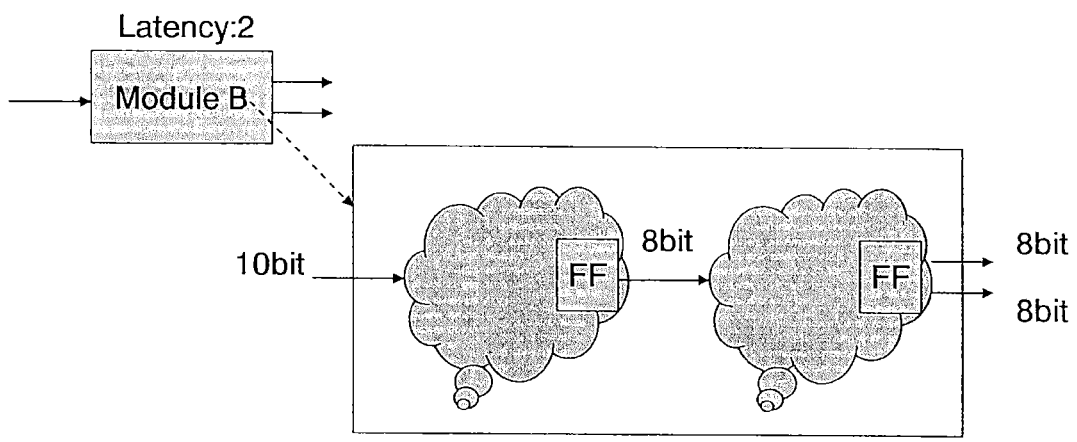
FIG. 34 is a diagram simply illustrating an internal configuration of Module B in FIG. 31.
Figure 35:
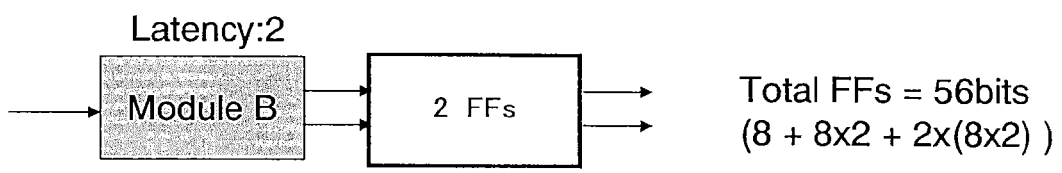
FIG. 35 is a diagram representing calculation of the number of FFs in the configuration of FIG. 34, which applies the related art.
Figure 36:
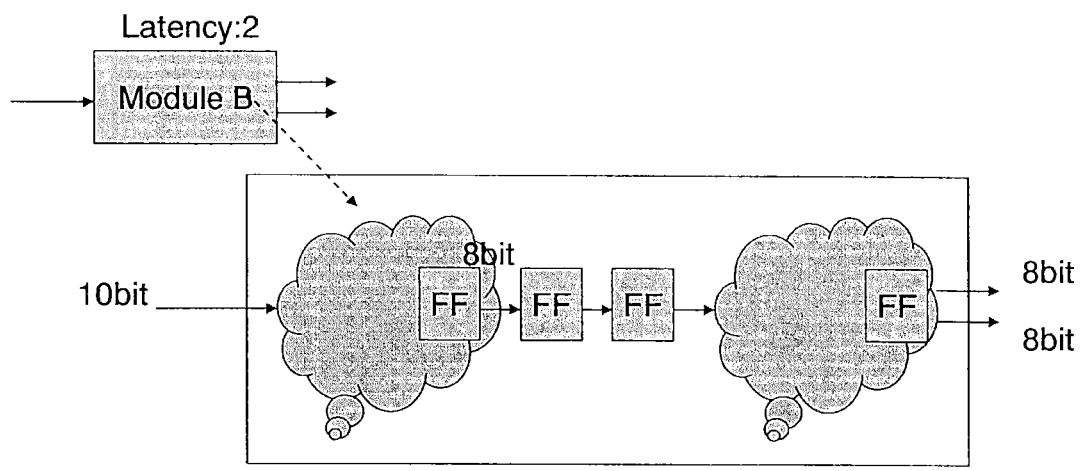
FIG. 36 is a configuration diagram of a case where FFs are inserted at positions in Module B of FIG. 31, which have a small FF bit width.
Figure 37:
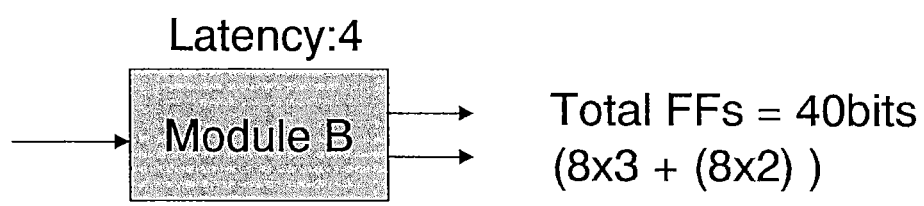
FIG. 37 is a diagram representing calculation of the reduced number of FFs in Module B of FIG. 36.

FIG. 29 illustrates a scheduling result showing candidates of the inserting position of the post-optimization inserting FF, which is calculated by the FF inserting position candidate selecting part 27 according to the second embodiment of the present invention. The FF inserting position candidates of the minimum analysis unit of FIG. 13 are a, b, c, d, e, f, and g in FIG. 29, and the FF inserting position candidates of the minimum analysis unit of FIG. 14 are a, b, c, and h in FIG. 29.

The FF inserting position candidate selecting part 27 writes, to the table 4, the above-mentioned scheduling result obtained after analysis in a manner that the scheduling result is divided into the FF inserting position range and other ranges. In other words, a scheduling result unrelated to the candidate is written to the table 4, and further, the scheduling result of merely a part that has become a candidate target after removing the scheduling result unrelated to the candidate is written to the table 4.

Step 8: FF Inserting Position Determining Step

The FF inserting position determining part 28 determines the FF inserting position within the inserting position candidate range in response to the designer's selection of any one of the following three modes:
(1) a circuit scale reducing mode in which an FF is inserted at a position that enables the smallest circuit scale;
(2) a critical path improving mode in which an FF is inserted at a position at which the critical path is largest; and
(3) a weighting determining mode in which the inserting position is determined based on weighting functions of the above-mentioned two modes.

FIG. 30 shows the number of FFs and delay information in each inserting position candidate for the post-optimization inserting FF according to the second embodiment of the present invention. The FF inserting position determining part 28 first extracts, as shown in FIG. 30, the number of FFs and delay information between respective FFs from the integrated scheduling result.

In the case of the circuit scale reducing mode, among the FF inserting position candidates in all of the minimum analysis units, a position that enables the smallest circuit scale, in other words, a position with the smallest total number of necessary inserting FF bits is calculated. This calculation method evaluates all combinations of inserting positions as candidates of the respective minimum analysis units. In this example, the total number of FF bits to be inserted is calculated in combinations satisfying one FF insertion among a, b, c, d, e, f, and g and one FF insertion among a, b, c, and h, and a position with the smallest number of bits to be inserted is specified. In this case, the total number of FF bits is the smallest when the FF is inserted to b.

In the critical path improving mode, delay information is acquired, and the FF is inserted at a position with the largest delay.

Further, the weighting determination is a determination obtained by combining the above-mentioned two modes. When a weighting coefficient of the total number of bits to be inserted is represented by ca and a weighting coefficient of the delay information is represented by cb, and when the total number of bits to be inserted, which is determined in the circuit scale reducing mode, is represented by db and the value with the largest delay, which is determined in the critical path improving mode, is represented by dd, (ca*db) and (cb*dd) are calculated so that a mode having a larger value may have priority.

Further, when there are a plurality of FF inserting positions, one FF inserting position may be determined through any one of the above-mentioned determination modes, and high level synthesis may be executed by the high level synthesis means 3 again to obtain delay information. Then, the second FF inserting position may be determined.

The above-mentioned determination mode is designated from the outside of the semiconductor integrated circuit design supporting means 1.

In this embodiment, it is assumed that FF insertion is determined to position b by the circuit scale reducing mode. A clock boundary is added to position b in the scheduling result, and the scheduling result is written to the table 4.

Step 9: High Level Synthesis Repeating Step

The high level synthesis repeating part 29 reads out, from the table 4, the locked scheduling result and the scheduling result generated by the latency re-adjusting part 26 or the FF inserting position determining part 28, and integrates the scheduling results. Further, the high level synthesis repeating part 29 divides the integrated scheduling result into scheduling results of module units, and writes the scheduling results to the table 4. Then, the high level synthesis repeating part 29 subjects the scheduling result obtained after optimization to high level synthesis (behavioral synthesis) again in cooperation with the high level synthesis means 3, to thereby obtain RTL.

As described above, the necessary delay that is required to be inserted between the modules is acquired based on the latency value of each module acquired based on RTL (HDL) or synthetic log obtained through high level synthesis. Further, a pin having an input that receives the FF is extracted from the RTL (HDL) or the synthetic log obtained through high level synthesis, to thereby acquire the number of stages of FF reception, that is, the input delay. Then, the latency re-adjusting part 26 determines the optimum delay based on the necessary delay and the input delay. Then, based on the RTL (HDL) or synthetic log obtained through high level synthesis, the total number of held FFs in each state of a module that has a pin to be subjected to FF insertion is determined, and the state having the minimum number of FFs is detected. Then, based on the FF inserting position obtained above, the high level synthesis means 3 subjects the entire circuit to high level synthesis again. As a result, it is possible to obtain HDL that is description language of RTL having a small circuit scale, and hence there is provided such an effect that a small circuit scale hardware configuration can be obtained in a short period of time without depending on the ability of a designer. Further, by reducing the number of stages of FFs, effects such as reduction in circuit latency (number of processing cycles) and high-speed processing can be obtained. Further, by inserting the FF at a position at which the delay is hard, an effect such as speed improvement can be obtained.

As described above, according to the second embodiment, the semiconductor integrated circuit design supporting apparatus cooperates with the high level synthesis means for executing high level synthesis of analyzing a behavioral description of an integrated circuit, which is written in high level language, to generate an RTL description, and utilizes the scheduling result output as the intermediate result when the high level synthesis means performs high level synthesis. Thus, the inserting position and the number of inserting stages of FFs to be inserted in the RTL description as a result of the high level synthesis are optimized. As a result, it is possible to obtain the semiconductor integrated circuit design supporting apparatus, method, and program capable of reducing the entire integrated circuit scale to improve the processing efficiency of the entire integrated circuit.

Note that, the semiconductor integrated circuit design supporting means 1 illustrated in FIG. 9 includes the input latch FF determining part 25, the latency re-adjusting part 26, the FF inserting position candidate selecting part 27, and the FF inserting position determining part 28, but not all of those parts are required to be provided. Specifically, merely the input latch FF determining part 25 and the latency re-adjusting part 26 may be provided, and the FF inserting position candidate selecting part 27 and the FF inserting position determining part 28 may be omitted. Even in this configuration, the FF to be inserted between the modules and the input latch FF may cancel each other out, and the circuit scale may be reduced. Further, merely the FF inserting position candidate selecting part 27 and the FF inserting position determining part 28 may be provided, and the input latch FF determining part 25 and the latency re-adjusting part 26 may be omitted. Even in this configuration, the circuit scale may be reduced or the critical path may be improved.

According to one embodiment of the present invention, it is possible to obtain HDL that is description language of RTL representing small circuit scale and high processing speed in a semiconductor integrated circuit, which may be used in design of the semiconductor integrated circuit.

What is claimed is:

1. A semiconductor integrated circuit design supporting apparatus configured to cooperate with a high level synthesis means for executing high level synthesis of analyzing a behavioral description, which describes a circuit behavior of an integrated circuit by high level language, to generate register transfer level (RTL) description, the semiconductor integrated circuit design supporting apparatus being further configured to optimize an inserting position and a number of inserting stages of flip-flops (FFs) to be inserted in the RTL description through the high level synthesis by utilizing, in cooperation with the high level synthesis means, a scheduling result including latency of each output pin of each module of the integrated circuit and information on delay between signal lines at each clock boundary inside the each module, the scheduling result being output as an intermediate result when the high level synthesis means performs the high level synthesis, the semiconductor integrated circuit design supporting apparatus having a computer with a central processor unit configured to provide parts comprising:
    a module analyzing part for extracting modules to be subjected to latency adjustment from the behavioral description;
    a latency provisionally adjusting part for calculating, as a number of stages of pre-optimization inserting FFs, a number of FFs required to be inserted for latency adjustment between the modules to be subjected to latency adjustment;
    an input latch FF determining part for extracting an input latch pin that is latched by an FF without interposing logic in a latter-stage module having, as an input, the FF that is required to be inserted, and calculating, as a number of stages of input latch FFs, a number of stages of input latch FFs that latch the input latch pin;
    a latency re-adjusting part for specifying, based on a relationship between the number of stages of pre-optimization inserting FFs, which is calculated by the latency provisionally adjusting part, and the number of stages of input latch FFs, which is calculated by the input latch FF determining part, the input latch FF and the FF that is required to be inserted, that cancel each other out, to thereby reduce a number of stages of FFs; and
    a high level synthesis repeating part for deleting, from the scheduling result, an FF specified to be reduced by the latency re-adjusting part so as to optimize the scheduling result, and then cooperating with the high level synthesis means again to generate the optimized RTL description based on the optimized scheduling result.

2. A semiconductor integrated circuit design supporting apparatus, configured to cooperate with a high level synthesis means for executing high level synthesis of analyzing a behavioral description, which describes a circuit behavior of an integrated circuit by high level language, to generate register transfer level (RTL) description, the semiconductor integrated circuit design supporting apparatus being further configured to optimize an inserting position and a number of inserting stages of flip-flops (FFs) to be inserted in the RTL description through the high level synthesis by utilizing, in cooperation with the high level synthesis means, a scheduling result including latency of each output pin of each module of the integrated circuit and information on delay between signal lines at each clock boundary inside the each module, the scheduling result being output as an intermediate result when the high level synthesis means performs the high level synthesis, the semiconductor integrated circuit design supporting apparatus having a computer with a central processor unit configured to provide parts comprising:
    a module analyzing part for extracting modules to be subjected to latency adjustment from the behavioral description;
    a latency provisionally adjusting part for calculating, as a number of stages of pre-optimization inserting FFs, a number of FFs required to be inserted for latency adjustment between the modules to be subjected to latency adjustment;

an FF inserting position candidate selecting part for selecting FF inserting position candidates inside a former-stage module to be subjected to latency adjustment and a latter-stage module to be subjected to latency adjustment in which the number of stages of pre-optimization inserting FFs, which is calculated by the latency provisionally adjusting part, is inserted, the FF inserting position candidates enabling achievement of the same timing and function as a case where the number of stages of pre-optimization inserting FFs is inserted between modules;

an FF inserting position determining part for selecting, from the FF inserting position candidates selected by the FF inserting position candidate selecting part, an inserting position that enables one of reduction in scale of the entire integrated circuit and improvement in processing efficiency of the entire integrated circuit, and specifying the inserting position of an FF required to be inserted inside a module as a substitute for the pre-optimization inserting FFs; and a high level synthesis repeating part for adding, to the scheduling result, the FF that is specified to be inserted by the FF inserting position determining part so as to optimize the scheduling result, and then cooperating with the high level synthesis means again to generate the optimized RTL description based on the optimized scheduling result.

3. A semiconductor integrated circuit design supporting method, comprising:

a high level synthesis step of executing high level synthesis processing of analyzing a behavioral description, which is stored in a storage part and describes a circuit behavior of an integrated circuit by high level language, to generate an RTL description, the semiconductor integrated circuit design supporting method optimizing an inserting position and a number of inserting stages of flip-flops (FFs) to be inserted in the RTL description through the high level synthesis processing by utilizing, in cooperation with the high level synthesis step, a scheduling result including latency of each output pin of each module of the integrated circuit and information on delay between signal lines at each clock boundary inside the each module, the scheduling result being output as an intermediate result when the high level synthesis processing is performed in the high level synthesis step, the semiconductor integrated circuit design supporting method further using a computer with a central processor unit to perform steps including:

a module analyzing step of extracting modules to be subjected to latency adjustment from the behavioral description stored in the storage part;

a latency provisionally adjusting step of calculating, as a number of stages of pre-optimization inserting FFs, a number of FFs required to be inserted for latency adjustment between the modules to be subjected to latency adjustment;

an input latch FF determining step of extracting an input latch pin that is latched by an FF without interposing logic in a latter-stage module having, as an input, the FF that is required to be inserted, and calculating, as a number of stages of input latch FFs, a number of stages of input latch FFs that latch the input latch pin;

a latency re-adjusting step of specifying, based on a relationship between the number of stages of pre-optimization inserting FFs, which is calculated in the latency provisionally adjusting step, and the number of stages of input latch FFs, which is calculated in the input latch FF determining step, the input latch FF and the FF that is required to be inserted, which cancel each other out, to thereby reduce a number of stages of FFs; and a high level synthesis repeating step of deleting, from the scheduling result, the FF specified to be reduced in the latency re-adjusting step so as to optimize the scheduling result, and then cooperating with the high level synthesis step again to generate the optimized RTL description based on the optimized scheduling result.

4. A semiconductor integrated circuit design supporting method, comprising:

a high level synthesis step of executing high level synthesis processing of analyzing a behavioral description, which is stored in a storage part and describes a circuit behavior of an integrated circuit by high level language, to generate an RTL description, the semiconductor integrated circuit design supporting method of optimizing an inserting position and a number of inserting stages of flip-flops (FFs) to be inserted in the RTL description through the high level synthesis processing by utilizing, in cooperation with the high level synthesis step, a scheduling result including latency of each output pin of each module of the integrated circuit and information on delay between signal lines at each clock boundary inside the each module, the scheduling result being output as an intermediate result when the high level synthesis processing is performed in the high level synthesis step, the semiconductor integrated circuit design supporting method further using a computer with a central processor unit to perform steps including:

a module analyzing step of extracting modules to be subjected to latency adjustment from the behavioral description stored in the storage part;

a latency provisionally adjusting step of calculating, as a number of stages of pre-optimization inserting FFs, a number of FFs required to be inserted for latency adjustment between the modules to be subjected to latency adjustment;

an FF inserting position candidate selecting step of selecting FF inserting position candidates inside a former-stage module to be subjected to latency adjustment and a latter-stage module to be subjected to latency adjustment in which the number of stages of pre-optimization inserting FFs, which is calculated in the latency provisionally adjusting step, is inserted, the FF inserting position candidates enabling achievement of the same timing and function as a case where the number of stages of pre-optimization inserting FFs is inserted between modules;

an FF inserting position determining step of selecting, from the FF inserting position candidates selected in the FF inserting position candidate selecting step, an inserting position that enables one of reduction in scale of the entire integrated circuit and improvement in processing efficiency of the entire integrated circuit, and specifying the inserting position of an FF that is required to be inserted inside a module as a substitute for the pre-optimization inserting FFs; and a high level synthesis repeating step of adding, to the scheduling result, the FF that is specified to be inserted in the FF inserting position determining step so as to optimize the scheduling result, and then cooperating with the high level synthesis step again to generate the optimized RTL description based on the optimized scheduling result.

5. A non-transitory computer readable medium containing a computer readable semiconductor integrated circuit design supporting program, the semiconductor integrated circuit design supporting program causing the computer with a central processor unit to perform steps including:
- a module analyzing step of extracting modules to be subjected to latency adjustment from a behavioral description;
- a latency provisionally adjusting step of calculating, as a number of stages of pre-optimization inserting flip flops (FFs), a number of FFs required to be inserted for latency adjustment between the modules to be subjected to latency adjustment;
- an input latch FF determining step of extracting an input latch pin that is latched by an FF without interposing logic in a latter-stage module having, as an input, the FF that is required to be inserted, and calculating, as a number of stages of input latch FFs, a number of stages of latch FFs that latch the input latch pin;
- a latency re-adjusting specifying, based on a relationship between the number of stages of pre-optimization inserting FFs, which is calculated by the latency provisionally adjusting step and the number of stages of input latch FFs, which is calculated by the input latch FF determining step the input latch FF and the FF that is required to be inserted, which cancel each other out, to thereby reduce a number of stages of FFs; and
- deleting, from a scheduling result, the FF specified to be reduced by the latency re-adjusting step—so as to optimize the scheduling result, and then cooperating with a high level synthesis means to generate an optimized register transfer level (RTL) description based on the optimized scheduling result.

6. A non-transitory computer readable medium containing a computer readable semiconductor integrated circuit design supporting program, the semiconductor integrated circuit design supporting program causing the computer with a central processor unit to perform steps including:
- a module analyzing step of extracting modules to be subjected to latency adjustment from a behavioral description;
- a latency provisionally adjusting step of calculating, as a number of stages of pre-optimization inserting flip flops (FFs), a number of FFs required to be inserted for latency adjustment between the modules to be subjected to latency adjustment;
- a FF inserting position candidate selecting step of selecting FF inserting position candidates inside a former-stage module to be subjected to latency adjustment and a latter-stage module to be subjected to latency adjustment in which the number of stages of pre-optimization inserting FFs, which is calculated by the latency provisionally adjusting step, is inserted, the FF inserting position candidates enabling achievement of the same timing and function as a case where the number of stages of pre-optimization inserting FFs subjected is inserted between modules;
- a FF inserting position determining step of selecting, from the FF inserting position candidates selected by the FF inserting position candidate selecting step, an inserting position that enables one of reduction in scale of the entire integrated circuit and improvement in processing efficiency of the entire integrated circuit, and specifying the inserting position of an FF that is required to be inserted inside a module as a substitute for the pre-optimization inserting FFs; and
- a high level synthesis repeating step of adding, to the scheduling result, the FF that is specified to be inserted by the FF inserting position determining step so as to optimize the scheduling result, and then cooperating with a high level synthesis means to generate an optimized register transfer level (RTL) description based on the optimized scheduling result.

\* \* \* \* \*